United States Patent [19]
Akiba et al.

[11] Patent Number: 5,122,844
[45] Date of Patent: Jun. 16, 1992

[54] QUANTUM WELL STRUCTURE AND SEMICONDUCTOR DEVICE USING THE SAME

[75] Inventors: Shigeyuki Akiba; Masashi Usami, both of Tokyo; Yuichi Matsushima, Tanashi; Kazuo Sakai, Tokyo; Katsuyuki Utaka, Musashino, all of Japan

[73] Assignee: Kokusai Denshin Denwa Kabushiki Kaisha, Tokyo, Japan

[21] Appl. No.: 706,542

[22] Filed: May 22, 1991

Related U.S. Application Data

[63] Continuation of Ser. No. 384,423, Jul. 21, 1989, abandoned.

[30] Foreign Application Priority Data

Jul. 27, 1988 [JP] Japan .................. 63-185578

[51] Int. Cl.$^5$ .................. H01L 33/00; H01L 27/12; H01L 29/161
[52] U.S. Cl. .................. 357/17; 357/4; 357/16; 357/22; 372/45; 372/54; 372/55
[58] Field of Search .................. 357/4, 16, 17, 22 A; 372/45, 54, 55

[56] References Cited

U.S. PATENT DOCUMENTS

| | | | |
|---|---|---|---|
| 4,802,181 | 1/1989 | Iwata | 372/45 |
| 4,816,878 | 3/1989 | Kano et al. | 357/4 |
| 4,857,971 | 8/1989 | Burnham | 357/4 |
| 4,862,471 | 8/1989 | Pankove | 372/45 |

OTHER PUBLICATIONS

Applied Physics Letters, vol. 52, No. 13, 28th Mar. 1988, pp. 1080-1082, N.Y., US; L. A. Kolodziejski et al.: "Excitonic trapping from atomic layer epitaxial ZnTe within ZnSe/(Zn,Mn)Se heterostructures".
Electronic Letters, vol. 13, No. 25/26, 9th Dec. 1982, pp. 1095-1097, London, GB; R. D. Burnham et al.: "Low-threshold single quantum-well (60 A) GaAlAs lasers grown by MO-CVD with MG AS p-type dopant".
Soviet Physics Semiconductors, vol. 22, No. 6, Jun. 1988, pp. 650-652, N.Y., US: Z. I. Alferov et al.: "Quantum-well separate-confinement InGaAsP/GaAs (gamma=0.86-0.78 mum) laser (Jth=100 A/Cm2, efficiency 59%)".

Primary Examiner—Rolf Hille
Assistant Examiner—David Ostrowski
Attorney, Agent, or Firm—Emmanuel J. Lobato; Robert E. Burns

[57] ABSTRACT

A quantum well structure is disclosed, which is comprised of a quantum well layer of a thickness substantially equal to the de Broglie wavelength of electrons and carrier confinement layers of an energy gap greater than that of the quantum well layer. A second material of a lattice constant different from that of a first material primarily for the quantum well layer is disposed in the quantum well layer to provide a phase shift in the period of the crystal lattice of the first material, thereby forming energy levels in the forbidden band of the quantum well layer. A semiconductor device which employs such a quantum well structure and is so constructed as to utilize its physical phenomenon which is caused by the energy levels in the forbidden band. In concrete terms, the present invention has its feature in allowing ease in the fabrication of an intermediate infrared or blue light emitting device, for instance.

10 Claims, 9 Drawing Sheets

QUANTUM WELL STRUCTURE AND SEMICONDUCTOR DEVICE USING THE SAME

This is a continuation of application Ser. No. 07/384,423, filed Jul. 21, 1989 now abandoned.

BACKGROUND OF THE INVENTION

The present invention relates to a quantum well structure composed of a quantum well layer and a carrier confinement layer of an energy gap greater than that of the former, and a semiconductor device employing such a quantum well structure.

A physical phenomenon, such as light emission or absorption by substances (materials), or a tunneling transport of electrons in electron devices, has recently come into wide use in semiconductor devices employing the quantum well structure in the field of electronics and is now a driving force in opening up new key industries. However, such a physical phenomenon largely depends on the energy gap intrinsic to the material used and hence is limited in its application accordingly.

Now, a conventional light emitting semiconductor device will be described as a concrete example.

Because of their excellent features such as small size, light weight, and high efficiency, light emitting semiconductor devices are now being used widely in fiber optic communications and various instrumentations as well as in magneto-optical disks, compact disks, laser printers, miniature display lamps, and various other terminal equipments. For further broading of their application it is of enormous importance to enlarge the range of emission wavelength of the light emitting semiconductor devices. There is a demand for green to blue light sources in the visible region and, in the infrared region, for light sources for analysing special gases and for fluoride fiber optic communications.

Conventional light emitting devices utilize, for emitting light, photons of an energy corresponding to the energy gap of the light emitting layer as mentioned above, and consequently, in case of changing the wavelength of light, they are subject to severe limitations in terms of materials used. This presents a serious problem in that the implementation of a blue light emitting device and an intermediate infrared light emitting device, in particular, is difficult.

Such a difficulty is experienced not only in light emitting devices but also in photo detectors. In the field of electronic devices many attempts are also being made for sophistication of the electron transport phenomenon by mutually combining various materials of different energy gaps, but these attempts are also limited basically by the energy gaps inherent to the materials used.

SUMMARY OF THE INVENTION

It is an object of the present invention to provide a quantum well structure which is free from the limitations by energy gaps inherent to the materials used, and a semiconductor device which employs such a quantum well structure.

The feature of the present invention resides in a quantum well structure, which is comprised of a quantum well layer of a thickness substantially equal to the de Broglie wavelength of electrons and carrier confinement layers of an energy gap greater than that of the quantum well layer, and in which a second material of a lattice constant different from that of a first material primarily for the quantum well layer is disposed in the quantum well layer to provide a phase shift in the period of the crystal lattice of the first material, thereby forming energy levels in the forbidden band of the quantum well layer. Another feature of the present invention lies in a semiconductor device which employs such a quantum well structure and is so constructed as to utilize its physical phenomenon which is caused by the energy levels in the forbidden band. In concrete terms, the present invention has its feature in allowing ease in the fabrication of an intermediate infrared or blue light emitting device, for instance.

BRIEF DESCRIPTION OF THE DRAWINGS

The present invention will be described in detail below in comparison with prior art with reference to the accompanying drawings, in which.

DETAILED DESCRIPTION

To make differences between prior art and the present invention clear, an example of prior art will first be described.

Figure 1:
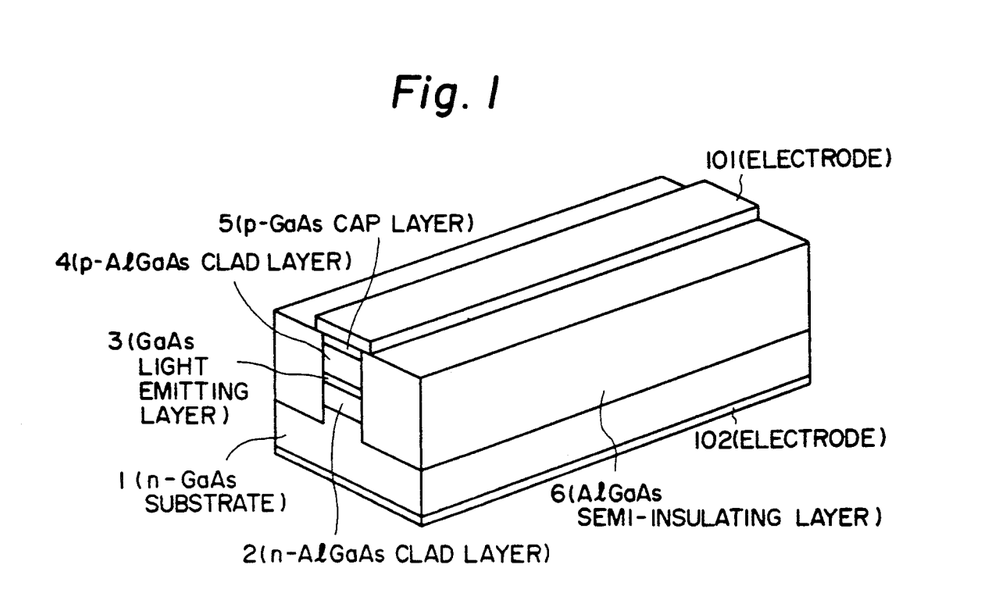
FIG. 1 is a schematic diagram showing the construction of a conventional light emitting device.
Figure 2:
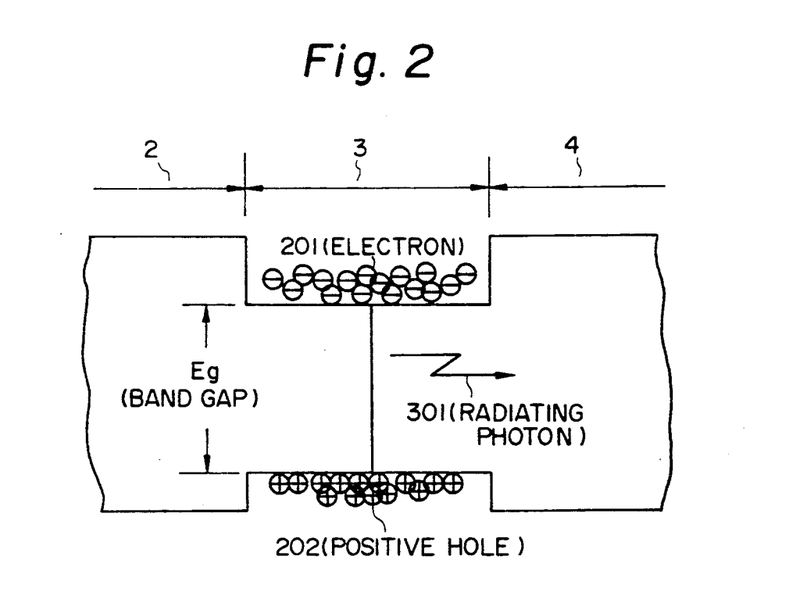
FIG. 2 is a diagram of an energy band structure explanatory of the principle of emission of light in the conventional light emitting device.

FIG. 1 schematically illustrates a semiconductor laser of the AlGaAs series which is a typical example of a conventional light emitting device. The illustrated semiconductor laser has a buried stripe structure in which an n-type AlGaAs clading layer 2, a GaAs light emitting layer 3, a p-type AlGaAs clading layer 4, and a p-type GaAs layer 5 for contacting with an electrode are laminated on an n-type GaAs substrate 1 and are buried in a semi-insulating AlGaAs layer 6 for lateral mode control and for a current flow limitation. The lattice constant of the AlGaAs layer 2 is substantially equal to the lattice constant of the GaAs substrate 1. By a current injection into the GaAs light emitting layer 3 across electrodes 101 and 102 a light emission or laser oscillation is obtained at a wavelength of around 0.88 μm corresponding to the energy gap of GaAs. FIG. 2 is a schematic diagram of the energy band for explaining the principle of emission of light in such a conventional light emitting device. By the recombination of electrons 201 and holes 202 injected across the electrodes 101 and 102 light corresponding to the energy gap Eg of the light emitting layer is emitted as emitted photons 301.

To change the wavelength of light which is emitted from the light emitting semiconductor device of such a structure, there is no choice but to change the semiconductor material used. For example, in case of emitting light in a band between 1.3 and 1.55 μm, it is necessary to laminate InGaAs material layers on an InP substrate, and for emitting light in the range of 2 to 4 μm, InAs, GaSb, or PbS material layers must be laminated on the InP substrate. Further, it is necessary to employ, as a blue light emitting material, a material of ZnSe or ZnS, or the chalcopyrite series, such as $Cu(GaAl)(SSe)_2$, but no excellent pn junctions are obtainable with such materials.

With reference to the accompanying drawings, the present invention will hereinafter be described in detail in connection with a light emitting device.

Figure 3A:
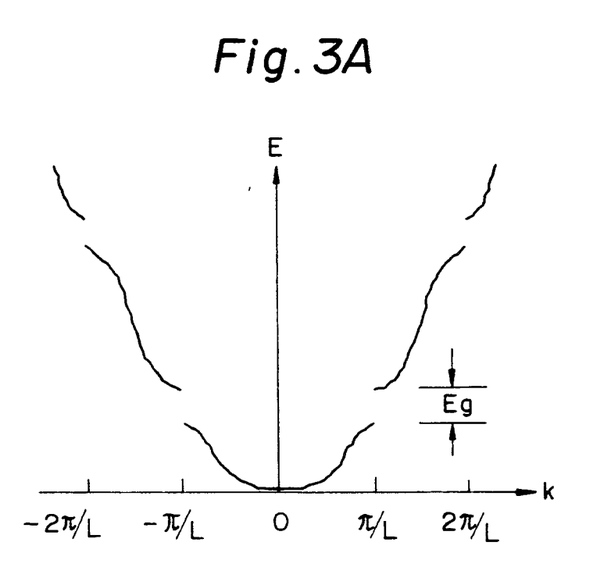
FIG. 3A is a schematic k-space energy diagram of the conventional light emitting device.
Figure 3B:
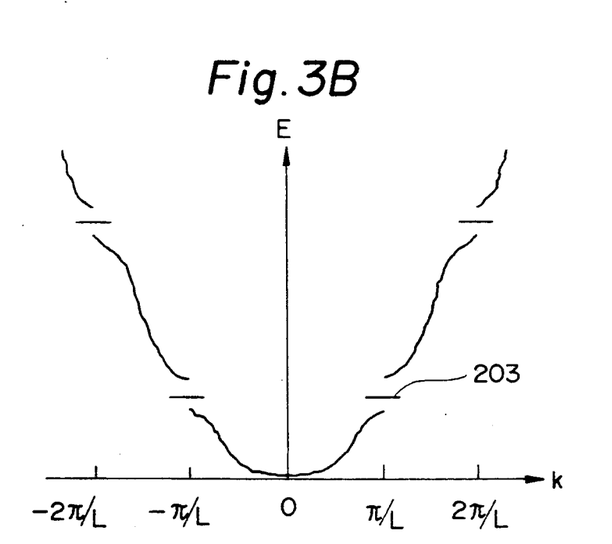
FIG. 3B is a schematic k-space energy diagram of a light emitting device of the present invention.
Figure 4A:
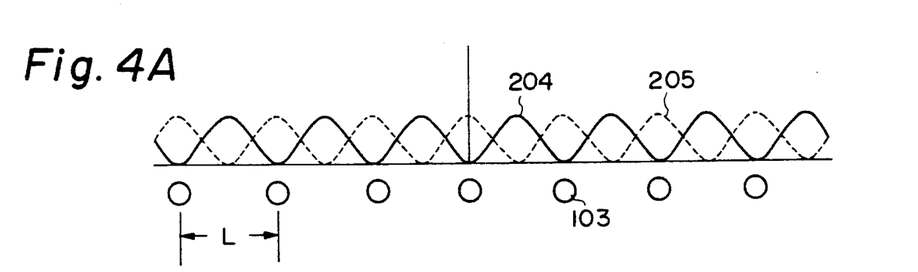
FIG. 4A is a waveform diagram showing the relationship between crystal lattice points and a square of the absolute value of a wave function in the conventional light emitting device.

A description will be given first of the principle of the present invention. FIG. 3 show k-space energy diagrams of electrons in a material. FIG. 3A is an energy diagram in a homogeneous material as in case of the light emitting layer of the conventional light emitting device. In the homogeneous material atoms are regularly arranged in a period L as indicated by periodic lattice points 103 in FIG. 4A. The energy E of an electron increases substantially in proportion to the square of k, but the energy value undergoes discontinuous changes at points where the value of k is an integral multiple of $\pm \pi/L$ as shown in FIG. 3A. The reason for this is as follows. For example, at the point where $k + \pm \pi/L$, the wave function of the electron creates a standing wave by a rightward traveling wave and a leftward traveling wave and the square of the absolute value of the wave function corresponding to the probability of presence of the electron is split into two indicated by 204 and 205 in FIG. 4A. Since the energy of an electron is small in case of the presence around an atom but large away from it, the energy values of the electrons corresponding to the wave function thereof greatly differ in cases of such squares of the absolute value of the wave function as indicated by 204 and 205, and this difference appears as an energy gap Eg. The value of the energy gap Eg depends on the semiconductor material used, and consequently, in the case of changing the energy gap Eg, it is necessary to use a different semiconductor material.

Figure 4B:
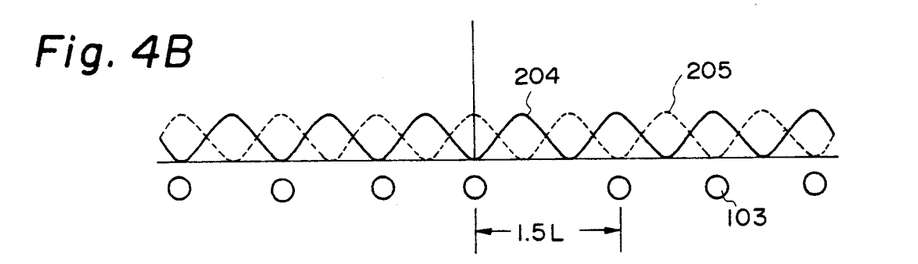
FIGS. 4B to 4D are waveform diagrams each showing the relationship between crystal lattice points and a square of the absolute value of a wave function in the light emitting device of the present invention.
Figure 4C:
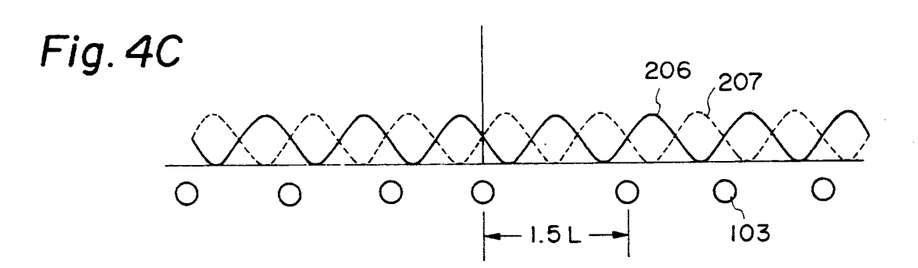
Figure 4D:
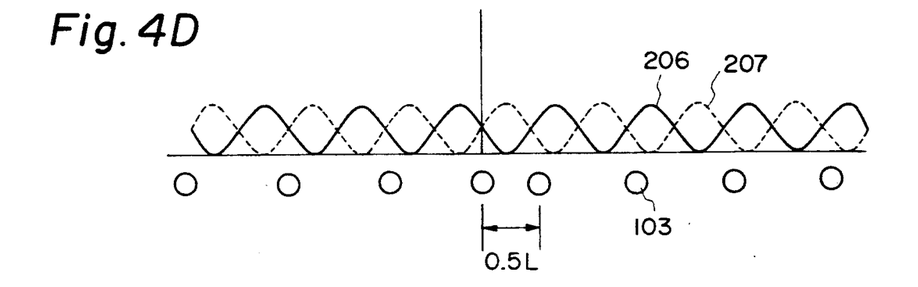

In view of the above, the present inventors considered a structure in which the period of the crystal lattice is phase-shifted as depicted in FIGS. 4B to 4D, in which the crystal lattice points 103 are phase-shifted by just one half (0.5L) the period L. As will be seen from FIG. 4B, the square 204 of the absolute value of the wave function is minimum at the lattice points 103 on the left-hand side of the phase shift point but maximum at the lattice points 103 on the right-hand side. In contrast thereto, the square 205 of the absolute value of the wave function is maximum at the lattice points 103 on the left-hand side of the phase shift point but minimum on the right-hand side. Consequently, electron energies for the both wave functions are equivalent to each other and the equivalent energy value is exactly one half that for the two wave functions in the case of the regular arrangement of the lattice points in FIG. 4A. As a result, energy levels 203 are created in the forbidden band as depicted in FIG. 3B. The squares of the absolute values of the actual wave functions for the levels 203 in the forbidden band become such as indicated by 206 and 207 in FIG. 4C. While in FIGS. 4B and 4C the phase shift corresponding to one-half the crystal lattice constant is provided by a spacing of 1.5L, a similar phase shift could be also implemented by a spacing of 0.5L as depicted in FIG. 4D, in which reference numerals 206 and 207 similarly indicate the squares of the absolute values of wave functions.

As described above, according to the present invention, a phase shift is provided in the crystal lattice to form energy levels in the forbidden band so that the levels are used to perform an electron transition for emission and absorption of light.

(Embodiment 1)

Figure 5A:
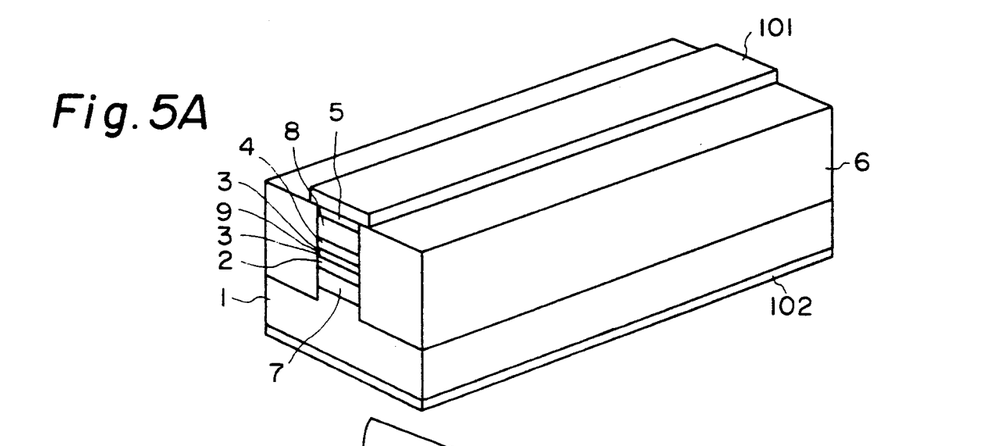
FIGS. 5A and 5B, 7A and 7B, 8A and 8B, and 9A and 9B are schematic diagrams illustrating light emitting devices of the present invention.
Figure 5B:
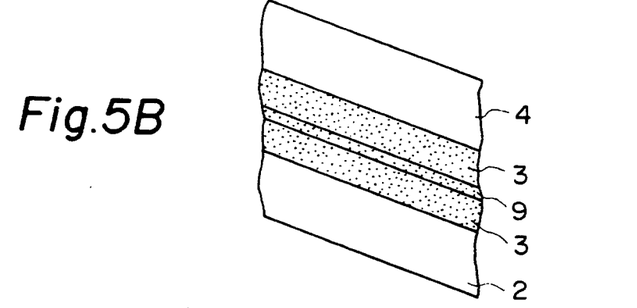

FIG. 5A is a schematic showing of an embodiment of the light emitting device which employs the quantum well structure according to the present invention. This embodiment differs widely from the prior art example of FIG. 1 in that the light emitting region is formed by a quantum well structure which is composed of a quantum well layer (3, 9) of a thickness substantially equal to the de Broglie wavelength of electrons and carrier confinement layers (2 and 4) of an energy gap greater than that of the quantum well layer (3, 9), and in that the quantum well layer (3, 9) is made up of light emitting layers 3 formed of a main first material GaAs and a layer 9 formed of a second material of AlInSb which is different in lattice constant from GaAs. In FIG. 5B there is shown, on an enlarged scale, the quantum well layer (3, 9) portion indicated by hatching. An n-type AlGaAs layer 7 and a p-type AlGaAs layer 8 are light confining layers, in each of which the composition ratio of Al to GaAs is higher than in the carrier confining AlGaAs layers 2 and 4 to provide a lower refractive index.

Figure 6:
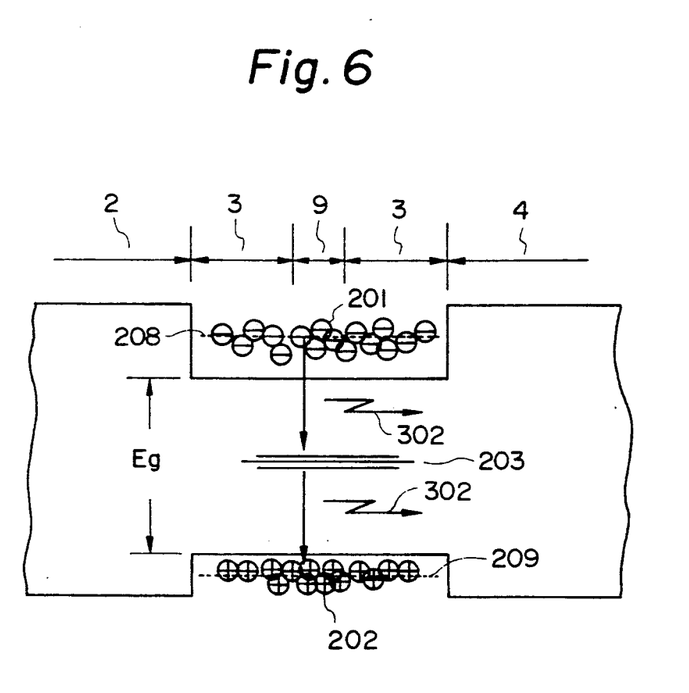
FIGS. 6 and 10 are energy band diagrams of the light emitting devices of the present invention.

FIG. 6 is a schematic diagram of the forbidden band of the quantum well structure according to the present invention. Quantum well levels of electrons and holes in such light emitting layer 3 formed of the principal first material GaAs are formed as indicated by 208 and 209, and electrons 201 and holes 202 are injected into regions in the vicinities of the quantum well levels as shown in FIG. 6. The layer 9 formed of the second material AlInSb sandwiched between the light emitting layers 3 of the quantum well layer (3, 9) has about the same energy gap as that of the GaAs light emitting layer 3 but has a lattice constant of about 6.2 which differs largely from the lattice constant, 5.64 of the GaAs light emitting layer 3. By forming the AlInSb layer 9 to a thickness of 31 corresponding to five cycles of its lattice constant, a phase shift corresponding to one-half the lattice constant is provided between the two GaAs light emitting layers 3 opposed across the AlInSb layer 9. Consequently, the energy levels 203 are formed in the forbidden band substantially centrally thereof as referred to previously in connection with the principle of the present invention. It is also possible to use, as the second material for the layer 9, CdTe which is nearly equal in energy gap to but largely different in lattice constant from the GaAs. In this case, the layer 9 is formed to have a thickness of about 22Å because the lattice constant of the CdTe is about 6.5Å. In such a light emitting device the transition of electrons across the energy levels 203 in the forbidden band, i.e. the recombination of electrons and holes occurs, by which light of an energy half that between the quantum well levels of the electrons and holes is emitted as emitted photons 302. That is to say, the energy gap Eg of the GaAs is about 1.4 eV, and assuming that the energy between the quantum well levels is around 1.6 eV, then photons of a 0.8 eV energy will be emitted. Laser diodes of the conventional structure made of GaAs series, shown in FIG. 1, oscillates at a wavelength of 0.88 μm or so, whereas, according to the structure of the present invention, a laser using the same series of semiconductor materials oscillates at a wavelength of 1.55 μm or so. As will be appreciated from the above, the light emitting device of the present invention can emit light of an energy which differs largely from the energy gap Eg determined in dependence on the semiconductor material used.

(Embodiment 2)

Figure 7A:
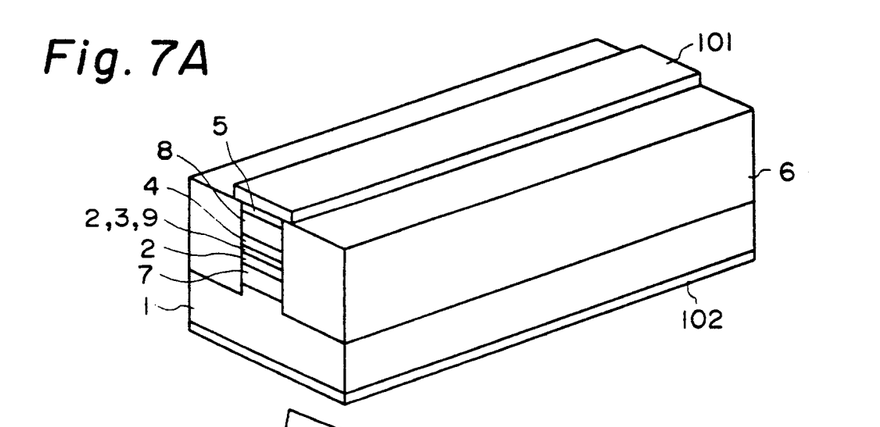
Figure 7B:
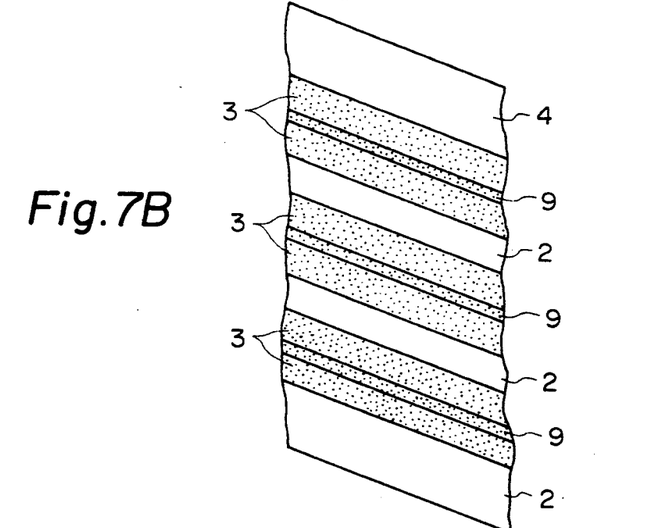

FIGS. 7A and 7B illustrate a second embodiment of the present invention, which uses the same series of semiconductor materials as in Embodiment 1. Embodiment 1 has one quantum well layer, but this embodiment has three quantum well layers and hence employs what is called a multiple quantum well structure. This embodiment is exactly identical in the principle of the emission of light and in operation with Embodiment 1 but affords reduction of the oscillation threshold value of the laser in accordance with the increased number of quantum well layers.

(Embodiment 3)

Figure 8A:
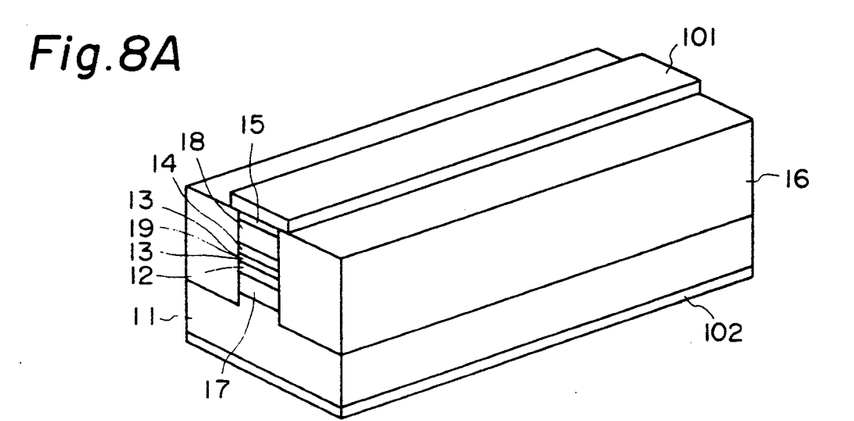
Figure 8B:
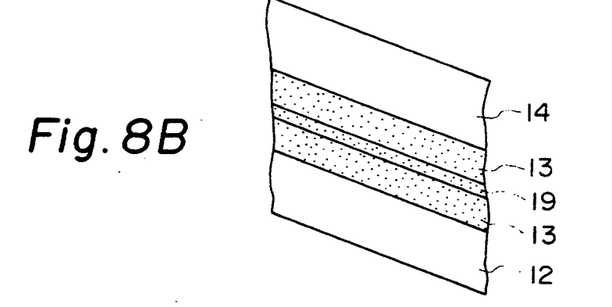

FIGS. 8A and 8B illustrate a third embodiment of the present invention, which uses a different series of semiconductor materials. On an n-type InP substrate 11 there are laminated an n-type InP clading layer 17 for light confinement, an n-type InGaAsP layer 12 for carrier confinement, a quantum well layer composed of InGaAsP light emitting layers 13 and an AlInSb layer 19, a p-type InGaAsP layer 14 for carrier confinement, a p-type InP cladding layer 18 for light confinement, and a p-type InGaAsP layer 15 for contacting with an electrode, these layers being buried in mesa-stripe form in a semi-insulating InP layer 16. The InGaAsP layers (12, 13, 14 and 15) are all lattice-matched with the n-type InP substrate 11. The light emitting region has a quantum well structure comprised of a quantum well layer (13, 19) of a thickness nearly equal to the de Broglie wavelength and the carrier confining layers (12, 14) having an energy gap greater than that of the quantum well layer. The quantum well layer is composed of the layers 13 formed of InGaAsP which is primarily a first material and the layer 19 formed of a second material AlInSb which has a lattice constant different from that of the InGaAsP. In FIG. 8B, there is shown, on an enlarged scale, the quantum well layer (13, 19) portion indicated by hatching. The AlInSb layer 19 of the second material, interposed between the two InGaAsP light emitting layers 13 of the quantum well layer, has about the same energy gap as that of each light emitting layer 13, but its lattice constant is about 6.35Å, markedly different from the lattice constant, 5.78Å, of the light emitting layer 13. By forming the AlInSb layer 19 to a thickness of 37Å corresponding to about six cycles of its lattice constant, a phase shift corresponding to one-half the lattice is provided between the two InGaAsP light emitting layers 13 opposed across the AlInSb layer 9. As a result, energy levels are created in the forbidden band substantially centrally thereof as mentioned previously with respect to the principle of the invention. In such a light emitting device the transition of electrons across the energy levels in the forbidden band, i.e. the recombination of electrons and holes occurs, emitting light of an energy equal to one half the energy gap Eg. That is to say, the energy gap between the quantum well levels of the InGaAsP light emitting layers 13 is about 0.95 eV and photons of a 0.475 eV energy, which is half the above energy gap, are emitted. In other words, the laser of the InGaAsP/InP series emits light at a wavelength of 2.6 μm or so.

(Embodiment 4)

Figure 9A:
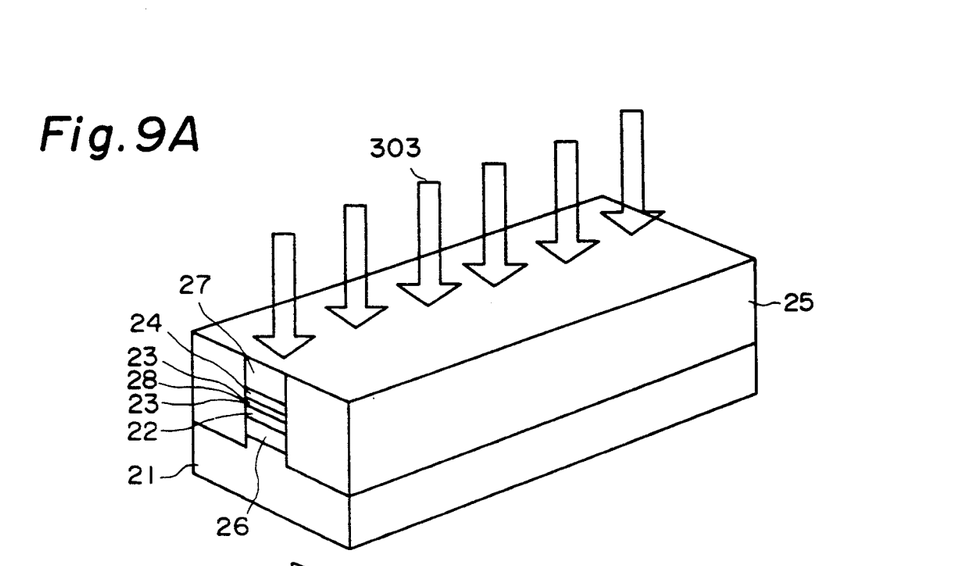
Figure 9B:
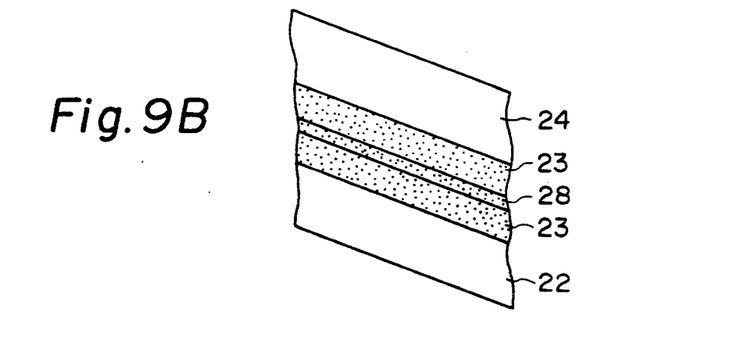
Figure 10:
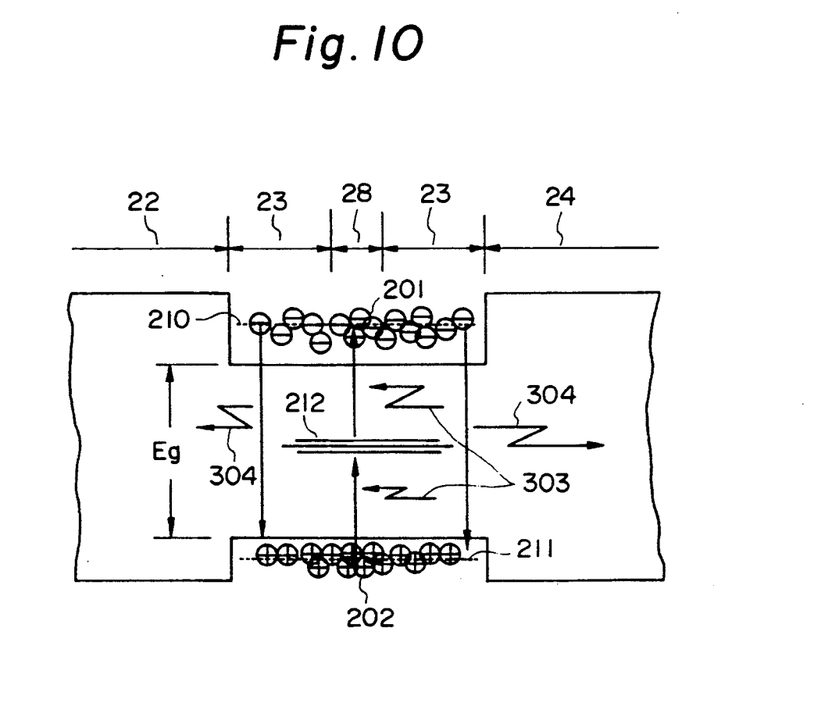

FIGS. 9A and 9B illustrate a fourth embodiment of the present invention, which uses a different series of materials or the III-V group materials and the II-VI group or chalcopyrite series materials and emits light through optical pumping. On a GaP substrate 21 there are laminated a light confining clading layer 26 formed of $Cu(GaAl)(SSe)_2$, a carrier confining $Cu(GaAl)(SSe)_2$ layer 22, a quantum well layer composed of light emitting $Cu(GaAl)(SSe)_2$ layers 23 and a GaP layer 28, a carrier confining $Cu(GaAl)(SSe)_2$ layer 24, between the quantum well levels of electrons and holes. By optical pumping using, as exciting photons 303, the output light of a GaAs high output semiconductor laser which has a photon energy of about 1.4 eV, the electrons and holes are excited at the quantum well levels 210 and 211 across the energy levels 212 in the forbidden band. The thus excited electrons 201 and holes 202 recombine, emitting blue light having a wavelength of approximately 0.44 μm corresponding to the above-mentioned energy 2.8 eV. In such a vigorous optical pumping, the probability of recombination of the electrons and holes across the energy levels 212 in the forbidden band is low and a direct transition between the quantum well levels is predominant. A laser oscillation of a blue color can be obtained by fully vigorous optical pumping. Incidentally, the GaP layer 28 may also be replaced by a layer of ZnTe which has an energy gap similar to that of the GaP.

While in the above the present invention has been described in connection with the examples of employing semiconductor substrates as of GaAs, InP and GaP, the invention can easily be implemented using substrates of other materials as well. The first and second materials are not limited specifically to the semiconductors but may also be conductive materials and insulating materials. Although in the above the present invention has been described as being applied to light emitting devices which are semiconductor lasers using the buried stripe structure, the invention is easily applicable as well to semiconductor lasers or light emitting diodes employing other stripe structures. It is evident from Embodiment 4 that the present invention can also be applied to photodetectors. Moreover, the energy levels in the forbidden band according to the present invention can also be utilized as tunneling levels of an electron tunneling transport phenomenon.

As described above in detail, the present invention permits the materialization of quantum well structures and semiconductor devices which are free from limitations by the energy gaps inherent to the materials used.

By providing the phase shift corresponding to one-half the crystal lattice constant of the first material, it is possible to easily obtain a quantum well structure having energy levels formed in the forbidden band and a semiconductor device employing such a quantum well structure.

With the quantum well layer made up of the InGaAsP layers 3 and the AlInSb layer 9 and the carrier confining layer (2, 4) formed by the InGaAsP layer it is possible to emit photons having an energy of approximately 0.5 eV.

With the quantum well layer composed of the Cu(GaAl)(SSe)_2 layers 23 and the GaP layer 28 and the carrier confining layer (22, 24) formed by the Cu(GaAl)(SSe)$_2$ layer, it is possible to emit photons having an energy of 2.8 eV.

The laser oscillation threshold value can be reduced through use of a multiple quantum well structure formed by laminating pluralities of quantum well layers and carrier confining layers.

A semiconductor device can easily be produced by using semiconductors as the first and second materials.

A semiconductor device which is not restricted by the energy gaps inherent to the materials used can be manufactured through use of the quantum well structure which utilizes a physical phenomenon caused by the energy levels in the forbidden band of the material.

A light emitting device which is not restricted by the energy gaps inherent to the material used can be produced through utilization of the physical phenomenon that the emission of light accompanies the transition of electrons across the energy levels.

A blue light emitting device can be produced through utilization of the physical phenomenon that the emission of light corresponding to the energy gap of the quantum well layer accompanies optical pumping across the energy levels.

The light emitting devices of the foregoing embodiments emit light not only of a wavelength corresponding to the energy gap inherent to the material used but also of a wavelength twice or half that wavelength. The present invention is widely applicable to fiber optic communications and various instrumentations as well as to magneto-optical disks, compact disks, laser printers, miniature display lamps, and various other terminal equipments. Hence the present invention is of great utility in practical use.

What we claim is:

1. For use in devices for emitting or absorbing photons a quantum well structure, which comprises a quantum well layer of a thickness substantially equal to the de Broglie wavelength of electrons and carrier confining layers of an energy gap greater than that of the quantum well layer, and in which the quantum well layer is sandwiched between the carrier confining layers.
    characterized in that the quantum well layer is composed of light emitting layers of a first material and a layer of a second material which is interposed between the light emitting layers, said second material having a lattice constant different from that of the first material, said second material having an energy gap substantially equal to that of the first material to provide a phase shift in the period of the crystal lattice of the first material, thereby forming energy levels in the forbidden band of the quantum well layer effective to perform an electron transition for emission of light or absorption of light in dependence upon said energy levels, and the phase shift corresponds to one-half the lattice constant of the first material.

2. For use in devices for emitting or absorbing photons a quantum well structure, which comprises a quantum well layer of a thickness substantially equal to the de Broglie wavelength of electrons and carrier confining layers of an energy gap greater than that of the quantum well layer, and in which the quantum well layer is sandwiched between the carrier confining layers,
    characterized in that the quantum well layer is composed of light emitting layers of a first material and a layer of a second material which is interposed between the light emitting layers, said second material having a lattice constant different from that of the first material, said second material having an energy gap substantially equal to that of the first material to provide a phase shift in the period of the crystal lattice of the first material, thereby forming energy levels in the forbidden band of the quantum well layer effective to perform an electron transition for emission of light or absorption of light in dependence upon said energy levels, and the quantum well layer being composed of InGaAsP layers and an AlInSb layer, and the carrier confining layers are formed by InGaAs layers.

3. For use in devices for emitting or absorbing photons a quantum well structure, which comprises a quantum well layer of a thickness substantially equal to the de Broglie wavelength of electrons and carrier confining layers of an energy gap greater than that of the quantum well layer, and in which the quantum well layer is sandwiched between the carrier confining layers.
    characterized in that the quantum well layer is composed of light emitting layers of a first material and a layer of a second material which is interposed between the light emitting layers, said second material having a lattice constant different from that of the first material, said second material having an energy gap substantially equal to that of the first material to provide a phase shift in the period of the crystal lattice of the first material, thereby forming energy levels in the forbidden band of the quantum well layer effective to perform an electron transition for emission of light or absorption of light in dependence upon said energy levels, and the quantum well layer is composed of Cu(GaAl)(SSe)$_2$ layers and a GaP layer, and the carrier confining layers are formed by Cu(GaAl)(SSe)$_2$ layers.

4. For use in devices for emitting or absorbing photons a quantum well structure, which comprises a quantum well layer of a thickness substantially equal to the de Broglie wavelength of electrons and carrier confining layers of an energy gap greater than that of the quantum well layer, and in which the quantum well layer is sandwiched between the carrier confining layers,
    characterized in the quantum well layer is composed of light emitting layers of a first material and a layer of a second material which is interposed between the light emitting layers, said second material having a lattice constant different from that of the first material, said second material having an energy gap substantially equal to that of the first material to provide a phase shift in the period of the crystal lattice of the first material, thereby forming energy levels in the forbidden band of the quantum well layer effective to perform an electron transition for emission of light or absorption of light in dependence upon said energy levels, and the quantum well layer is composed of a multiple quantum well structure formed by laminating pluralities of quantum well layers and carrier confining layers.

5. For use in devices for emitting or absorbing photons a quantum well structure, which comprises a quantum well layer of a thickness substantially equal to the de Broglie wavelength of electrons and carrier confining layers of an energy gap greater than that of the quantum well layer, and in which the quantum well layer is sandwiched between the carrier confining layers, characterized in that the quantum well layer is composed of light emitting layers of a first material and a layer of a second material which is interposed between the light emitting layers, said second material having a lattice constant different from that of the first material, said second material having an energy gap substantially equal to that of the first material to provide a phase shift in the period of the crystal lattice of the first material, thereby forming energy levels in the forbidden band of the quantum well layer effective to perform an electron transition for emission of light or absorption of light in dependence upon said energy levels, and said first and second materials are semiconductors.

6. A semiconductor device, which has a quantum well structure comprising a quantum well layer of a thickness substantially equal to the de Broglie wavelength of electrons and carrier confining layers of an energy gap greater than that of the quantum well layer, and in which the quantum layer is sandwiched between the carrier confining layers, characterized in that a second material of lattice constant different from that of a main first material of the quantum well layer is disposed in the quantum well layer to provide a phase shift in the period of the crystal lattice of the first material to form energy levels in the forbidden band of the quantum well layer for utilizing a physical phenomenon which is caused by the energy levels in the forbidden band, and caused by the transition of electrons across the energy levels.

7. A semiconductor device, which has a quantum well structure comprising a quantum well layer of a thickness substantially equal to the de Broglie wavelength of electrons and carrier confining layers of an energy gap greater than that of the quantum well layer, and in which the quantum layer is sandwiched between the carrier confining layers, characterized in that a second material of lattice constant different from that of a main first material of the quantum well layer is disposed in the quantum well layer to provide a phase shift in the period of the crystal lattice of the first material to form energy levels in the forbidden band of the quantum well layer for utilizing a physical phenomenon which is caused by the energy levels in the forbidden band, and the physical phenomenon is the emission of light corresponding to the energy gap of the quantum well layer which is caused by optical pumping across the energy levels.

8. A semiconductor device, which has a quantum well structure comprising a quantum well layer of a thickness substantially equal to the de Broglie wavelength of electrons and carrier confining layers of an energy gap greater than that of the quantum well layer, and in which the quantum layer is sandwiched between the carrier confining layers, characterized in that a second material of lattice constant different from that of a main first material of the quantum well layer is disposed in the quantum well layer to provide a phase shift in the period of the crystal lattice of the first material to form energy levels in the forbidden band of the quantum well layer for utilizing a physical phenomenon which is caused by the energy levels in the forbidden band, and the phase shift corresponds to one-half the lattice constant of the first material.

9. A semiconductor device according to claim 7 or 8, characterized in that the phase shift corresponds to one-half the crystal lattice constant of the first material.

10. A light-emitting semiconductor device having a quantum well structure comprising, a quantum well layer of a thickness substantially equal to the de Broglie wavelength of electrons and carrier confining layers of an energy gap greater than that of the quantum well layer, and the quantum well layer being sandwiched between the carrier confining layers, the quantum well layer comprising a light-emitting main first material and a second material of a lattice constant different from that of the main first material disposed in the quantum well layer, the second material having an energy gap substantially equal to that of the first material, thereby to provide a phase shift in the period of the crystal lattice of the main first material effective to form energy levels in the forbidden band of the quantum well layer for effecting light emission in response to optical pumping and of color characteristics dependent upon the energy levels in the forbidden band, and the phase shift corresponds to one-half the lattice constant of the first material.

* * * * *